(12) United States Patent
Fu et al.

(10) Patent No.: US 7,658,802 B2
(45) Date of Patent: Feb. 9, 2010

(54) APPARATUS AND A METHOD FOR CLEANING A DIELECTRIC FILM

(75) Inventors: Xinyu Fu, Fremont, CA (US); John Forster, San Francisco, CA (US); Wei W. Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 459 days.

(21) Appl. No.: 11/284,775

(22) Filed: Nov. 22, 2005

(65) Prior Publication Data

US 2007/0113868 A1    May 24, 2007

(51) Int. Cl.
*B08B 6/00* (2006.01)
(52) U.S. Cl. .......................................... 134/1.1; 216/67
(58) Field of Classification Search ........................ None
See application file for complete search history.

(56) References Cited

U.S. PATENT DOCUMENTS

| | | | | |
|---|---|---|---|---|
| 4,610,770 | A | * | 9/1986 | Saito et al. ................ 204/192.1 |
| 4,996,077 | A | | 2/1991 | Moslehi et al. |
| 5,045,166 | A | | 9/1991 | Bobbio |
| 5,354,443 | A | | 10/1994 | Moslehi |
| 6,031,239 | A | * | 2/2000 | Shi et al. ................ 250/492.21 |
| 6,207,487 | B1 | | 3/2001 | Kim et al. |
| 6,242,808 | B1 | | 6/2001 | Shimizu et al. |
| 6,251,242 | B1 | | 6/2001 | Fu et al. |
| 6,277,249 | B1 | | 8/2001 | Gopalraja et al. |
| 6,284,646 | B1 | | 9/2001 | Leem |
| 6,305,314 | B1 | | 10/2001 | Sneh et al. |
| 6,335,240 | B1 | | 1/2002 | Kim et al. |
| 6,344,419 | B1 | | 2/2002 | Forster et al. |
| 6,348,376 | B2 | | 2/2002 | Lim et al. |
| 6,358,829 | B2 | | 3/2002 | Yoon et al. |

(Continued)

FOREIGN PATENT DOCUMENTS

JP      2000311868 A    * 11/2000

(Continued)

OTHER PUBLICATIONS

International Search Report and Written Opinion in PCT/US06/61033, dated Sep. 25, 2008, 12 pages.

(Continued)

*Primary Examiner*—Allan Olsen
(74) *Attorney, Agent, or Firm*—Patterson & Sheridan, LLP (57) ABSTRACT

An apparatus and a method of cleaning a dielectric film are provided in the present invention. In one embodiment, an apparatus of cleaning a dielectric film the apparatus includes a chamber body adapted to support a substrate therein, a remote plasma source adapted to provide a plurality of reactive radicals to the chamber body, a passage coupling the remote plasma source to the chamber body, and at least one magnet disposed adjacent the passage. In another embodiment, a method of cleaning a dielectric film that includes providing a substrate having an at least partially exposed dielectric layer disposed in a process chamber, generating a plurality of reactive radicals in a remote plasma source, flowing the reactive radicals from the remote plasma source into the process chamber through a passage having at least one magnet disposed adjacent the passage, and magnetically filtering the reactive radicals passing through the passage.

15 Claims, 5 Drawing Sheets

U.S. PATENT DOCUMENTS

| | | |
|---|---|---|
| 6,372,598 B2 | 4/2002 | Kang et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,458,701 B1 | 10/2002 | Marsella et al. |
| 6,464,779 B1 | 10/2002 | Powell et al. |
| 6,468,924 B2 | 10/2002 | Maejlma |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,880 B2 | 12/2003 | Haukka et al. |
| 6,686,271 B2 | 2/2004 | Raaijmakers et al. |
| 6,929,727 B2 * | 8/2005 | Gorokhovsky .......... 204/298.41 |
| 7,300,559 B2 * | 11/2007 | Gorokhovsky .......... 204/192.38 |
| 2003/0029837 A1 * | 2/2003 | Trow ........................... 216/67 |
| 2003/0059538 A1 | 3/2003 | Chung et al. |
| 2004/0168637 A1 * | 9/2004 | Gorokhovsky ......... 118/723 ER |
| 2007/0113868 A1 | 5/2007 | Fu et al. |
| 2007/0190802 A1 | 8/2007 | Aoyama et al. |
| 2007/0209931 A1 | 9/2007 | Miller |

FOREIGN PATENT DOCUMENTS

WO     WO 9820184 A1 *    5/1998

OTHER PUBLICATIONS

Korean Office Action. Dec. 16, 2008.

* cited by examiner

APPARATUS AND A METHOD FOR CLEANING A DIELECTRIC FILM

BACKGROUND OF THE INVENTION

1. Field of the Invention

The present invention generally relates to an apparatus and a method for cleaning the surface of a substrate. More specifically, the present invention provides an apparatus and a method for cleaning the surface of a dielectric film.

2. Description of the Related Art

Interconnect structures of integrated circuits and semiconductor devices are typically fabricated by forming a series of dielectric layers and conductive layers in order to create a three dimensional network of conductive layers separated by dielectric material. The interconnect structure may be fabricated using, for example, a damascene structure in which a dielectric layer such as a low k dielectric layer is formed atop one or more conductive plugs or sub-layers. In order to form an electrical connection to the conductive sub-layers, the dielectric is patterned and etched to define via openings therethrough. Formation of the openings within the dielectric layer exposes a portion of the conductive line. Therefore, reliable formation of these interconnect features is an important factor in ensuring the quality, performance and reliability of devices formed on individual substrates and in each die.

The market for integrated circuits and semiconductor devices continually requires faster circuitry and greater circuit density, e.g., including millions of components on a single chip. As a result, the dimensions of the integrated circuit components shrink, and the choice of materials used to fabricate such components becomes increasingly important. For example, low resistivity metal interconnects, such as copper and aluminum, that provide conductive paths between the components on the integrated circuits, now require low dielectric constant layers, e.g., having a dielectric constant $\leq 4$, between the metal interconnects to provide insulating inter-metal layers that reduce capacitive coupling between adjacent metal lines, thereby enabling reliable performance at the same line widths.

Low k materials conventionally used as dielectric layers include un-doped silicon glass (USG), fluorine-doped silicon glass (FSG), carbon doped silicon dioxide, and polytetrafluoroethylene, among other materials, deposited as a film on a substrate. Before forming the conductive layer on the etching-defined dielectric layer, it is desirable to clean the top surface of the dielectric film to remove residual contaminants, such as native oxides and/or organic materials from etching and/or ashing processes. Removing contaminants reduces contact resistance and/or prevents adhesion loss at the interface of the conductive layer to be deposited.

A precleaning procedure may be used to remove contaminants from the dielectric film surface prior to deposition of the conductive layer. However, conventional in-situ plasma used for precleaning the dielectric layer may damage or resputter the dielectric film surface or generate unwanted charged particles in the process chamber prior to the subsequent conductive layer deposition. As such, low k dielectric film cleaned by using in-situ plasma techniques may result in film degradation and defects. Additionally, carbon doped low k materials tend to experience carbon depletion or "k loss," in which the dielectric constant of the low k material is increased after exposure to the plasma used in the cleaning procedure. As a result, undesired cross-talk and RC delay become more problematic after the cleaning procedure.

Therefore, there is a need in the art for an improved low k dielectric cleaning process.

SUMMARY OF THE INVENTION

An apparatus and a method for cleaning a dielectric film are provided. In one embodiment, the apparatus includes a chamber body adapted to support a substrate therein, a remote plasma source adapted to provide a plurality of reactive radicals to the chamber body, a passage coupling the remote plasma source to the chamber body, and at least one magnet disposed adjacent the passage.

In another embodiment, a method of cleaning a dielectric film that includes providing a substrate having an at least partially exposed dielectric layer disposed in a process chamber, generating a plurality of reactive radicals in a remote plasma source, flowing the reactive radicals from the remote plasma source into the process chamber through a passage having at least one magnet disposed adjacent the passage, and magnetically filtering the reactive radicals passing through the passage.

In yet another embodiment, a method of cleaning a dielectric film that includes providing a substrate having an at least partially exposed dielectric layer disposed in a first process chamber, generating a plurality of reactive radicals in a remote plasma source, flowing the reactive radicals from the remote plasma source into the process chamber through a passage having at least one magnet disposed adjacent the passage, magnetically filtering charged particles from the reactive radicals passing through the passage, removing charged particles passing from the remote plasma source, cleaning exposed portions of the dielectric layer using the filtered radicals, transferring the cleaned substrate to a second processing chamber without breaking vacuum, and depositing a liner layer on the cleaned substrate in the second chamber.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally provide an apparatus for cleaning dielectric layers using a remote plasma source. The apparatus preserves the quality of the dielectric film by reducing the number of charged particles passing from the remote plasma source during cleaning of the dielectric layer.

The present invention additionally provides a method for cleaning a dielectric layer. Cleaning of the post-etched dielectric layer removes contaminants which improves the adhesion of the subsequent conductive layer deposition and ultimately improves the integrity and reliability of the devices formed.

In one embodiment, the dielectric layer may be a low k material. The low k dielectric layer comprises a dielectric material having a k value of less than about 4.0, such as from about 2.0 to about 4.0, about 2.0 to 3.0, or a k value less than about 2.7. An example of a suitable low k dielectric layer is available under the trade name Black Diamond™, a low k silicon oxycarbide fabricated by Applied Materials, Inc., located in Santa Clara, Calif. In yet another embodiment, the suitable low-k dielectric layers may comprise silicon combined with at least one of oxygen, carbon, and hydrogen.

After etching of the dielectric layer, the substrate surface may have damaged silicon film or metal residues. Residual photoresist may also be present on the substrate surface from a photoresist stripping or ashing process. Residual polymer may also be present from etching the dielectric layer. To mitigate and/or eliminate such damage, a remote plasma pre-cleaning process is performed prior to conductive layer deposition.

The cleaning process of the present invention is conducted in a process chamber having a filtered remote plasma source. A process chamber having a remote plasma source that may be adapted to benefit from the invention is available from Applied Material, Inc.

Figure 1:
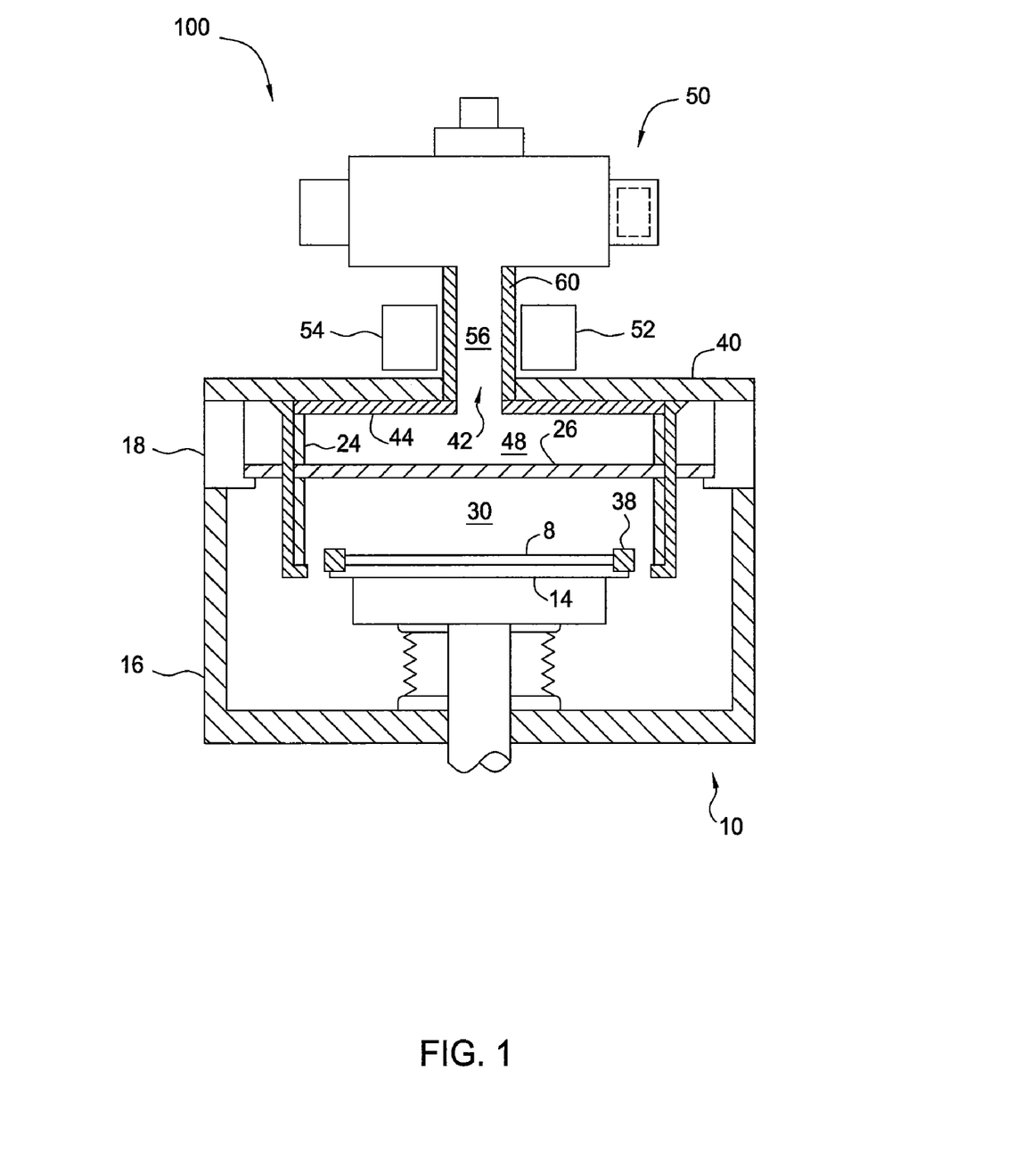
FIG. 1 is a schematic sectional view of one embodiment of a reactive preclean chamber in accordance with this invention.

FIG. 1 illustrates a schematic sectional view of one embodiment of a remote plasma source (RPS) processing chamber 100 having a filtered remote plasma source 50 and a chamber body 10. The processing chamber 100 has a chamber body 10 that includes a chamber adapter 16, an adapter 18 and a lid 40. The chamber adapter 16 and the lid 40 may be fabricated from aluminum, stainless steel or other suitable materials. The lid 40 is removably coupled to the chamber adapter 16 to define a process region 30 therein.

A heater 14 is disposed in the process region 30 of the chamber body 10. The heater 14 may be utilized to provide temperature to the substrate 8, thereby heating or cooling the substrate during process. The heater 14 supports the substrate 8 thereon during a process, such as cleaning of the surface of the substrate as further described below. The heater 14 is coupled to a bottom of the chamber adapter 16 and supports a focus ring 38 disposed on its outer periphery. The focus ring 38 circumscribes the wafer 8 during processing. In one embodiment, the focus ring 38 may be fabricated from quartz.

An adapter 18 is disposed between the lid 40 and the chamber adapter 16 and supports a gas distribution plate 26 thereon. A plenum 48 is defined between the gas distribution 26 plate and the lid 40. The gas distribution plate 26 includes a plurality of apertures to allow gases flowing into the plenum 48 through a port 42 formed in the lid 40 to be distributed across the substrate 8 disposed in the process region 30.

The remote plasma source 50 is coupled to the port 42 by a conduit 56. Examples of the suitable remote plasma sources are available from Applied Materials Inc. The conduit 56 provides a passage wherein the reactive radicals generated in the remote plasma source 50 are filtered before entering the process region 30. The reactive radicals generated therefrom include ions, charged species, and other reactive species. In one embodiment, the gases flowing through the conduit 56 are filtered by a magnetic field generated by at least one magnet disposed adjacent to the conduit 56.

In the embodiment depicted in FIG. 1, a first magnet 52 and a second magnet 54 are disposed adjacent the conduit 56. The magnets 52, 54 may be adhered or secured in a predefined position adjacent the conduit 56. In one embodiment depicted in FIG. 1, the magnets 52, 54 are fastened or adhered to the conduit 56 by a fastener, an adhesive layer or other suitable methods for securing the magnets 52, 54 may be utilized. It is also contemplated that the magnets 52, 54 may be secured to the chamber lid 40 or other portion of the chamber body 10. The relative distance between the magnet and the passage formed within the conduit 56 affects the strength of the magnetic field passing through the conduit 56, and thereby affects the filtering efficiency. Thus, in one embodiment, the magnets may be secured in a repositionable manner to allow the strength of the magnetic field to be selected to provide a pre-determined filtering effect.

Figure 2A:
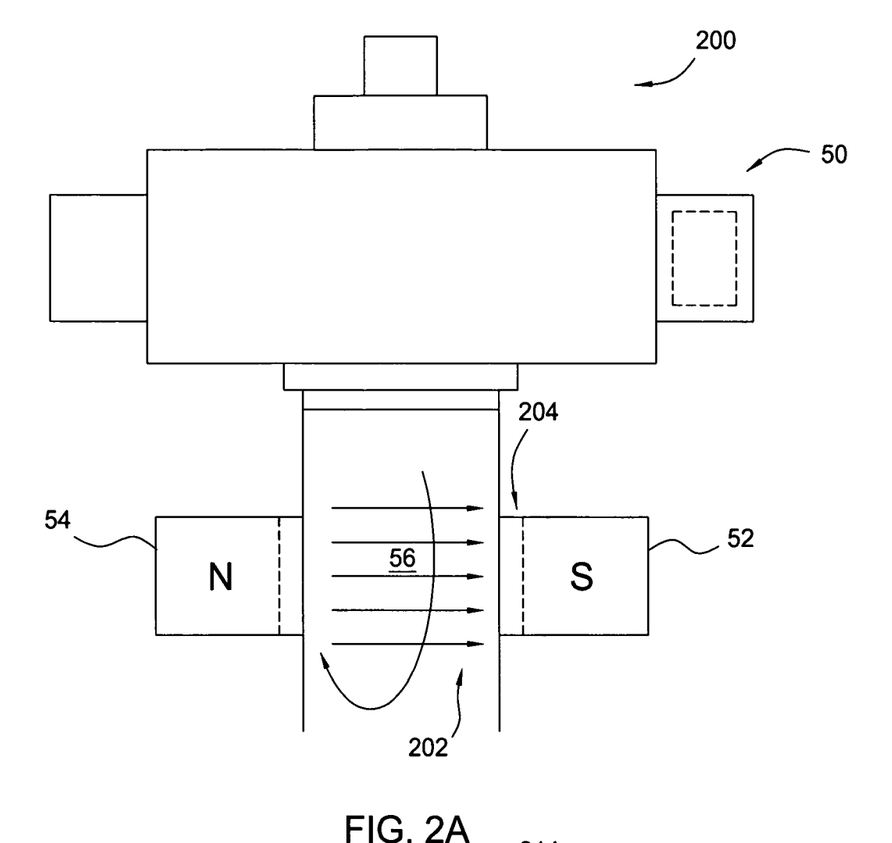
FIG. 2A is a schematic sectional view of one embodiment of two opposed magnets in accordance with this invention.
Figure 2B:
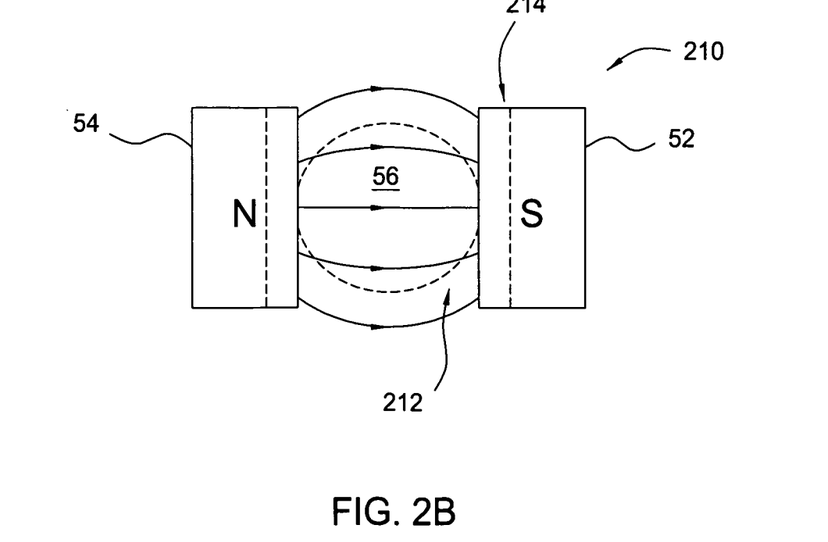
FIG. 2B is a schematic top view of a magnetic field present between two opposed magnets of FIG. 2A.
Figure 3:
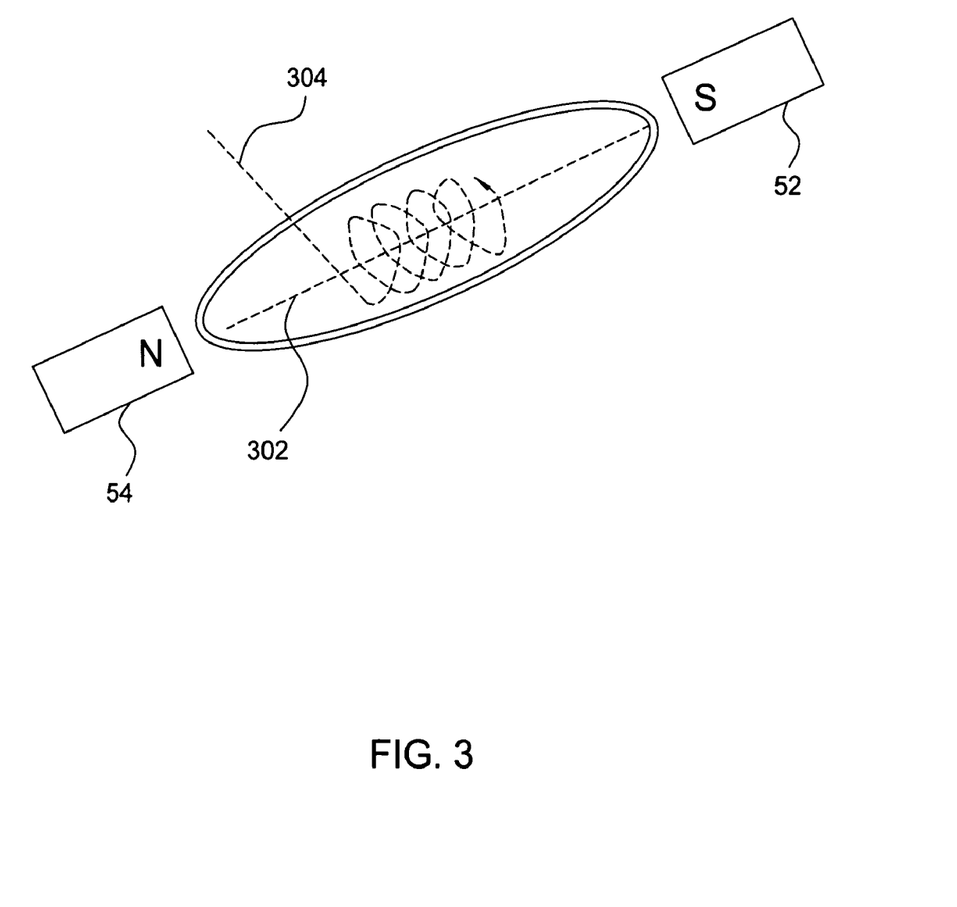
FIG. 3 is a top view of one embodiment of the flowing path of a charged particle magnifying by the magnets in accordance with this invention.

FIGS. 2A-B depict one embodiment of the magnets 52, 54 disposed on opposite sides of the conduit 56. It is believed that undesired charged particles may be generated from ions or charged species and may leak from conventional remote plasma sources and impacts the substrate, thereby resulting in degraded film property after the cleaning process. In one embodiment of the present invention, two opposed magnets 52, 54 are used to generate the magnetic field to filter charged particles entrained with the reactive radicals flowing from the remote plasma source 50. The opposed magnets 52, 54 create a magnetic field 202, 212 within the connecting conduit 56 to provide a filtering effect that captures charged particles in the conduit 56, as shown in system 200 and 210. The generated magnetic field has a substantially horizontal direction 302 between two opposed magnets across the conduit 56 that confines the moving path 304 of the charged particles. As shown in the FIG. 3, the charged particles are filtered and restrained by the magnetic field line 302 and tend to whirl and move along the magnetic field line 302. The moving path 304 of the charged particles is shown in the FIG. 3. As the charged particles flow through the conduit, the charged particles are slowed down, diverted, or both. The passing charged particles are drawn in contact with the wall of the conduit and become electrically neutral, non-ionic species. As such, substantially only the filtered, electrically neutral radicals are delivered to the surface of the substrate to react with and clean contaminants thereon. Thus, the undesired charged particles are efficiently filtered out of the gas stream entering the process region 30.

As described above, the strength of the magnetic field may be adjustable based on the different process requirement. Under different process conditions, different energy of the electrons may be produced by different ions and reactive radicals introduced from the remote plasma source. A stronger magnetic field may be applied to capture the ions with higher energy charged from the electrons. In contrast, a weaker magnetic field may be applied to capture the ions with lower energy charged from the electrons. In one embodiment, the magnetic field may be adjusted by using different magnets, i.e., replacing magnets with different strength. In another embodiment, the magnetic field may also be adjusted by varying different distance between the opposed magnets 52, 54. The distance between magnets 52, 54 can be shortened by using a conduit with smaller diameters. Additionally, the distance between the magnets 52, 54 can be lengthened by allowing an air gap between the magnets and the conduit, or inserting an intervening material 204, 214 between the conduit and the magnets, as shown in FIG. 2. Examples of suitable materials include glass boards, alumina pieces or other nonmagnetic materials. The magnetic field generated thereby is reduced inverse proportionally with the distance increased between the opposed magnets. In one embodiment, the opposed magnets 52, 54 may be placed at a distance about 0 to about 20 cm. The magnetic field generated thereby is about 1000 to about 100 gauss. In another embodiment, the opposed magnets 52, 54 may be placed at a distance of about 0 to about 8 cm, generating a magnetic field between about 800 to about 100 gauss. In yet another embodiment, the opposed magnets 52, 54 may be placed at a distance of about 1 to about 5 cm, generating a magnetic field between about 600 to about 400 gauss.

Referring back to FIG. 1, the reactive radicals may be further filtered by providing a quartz surface in the flow path of the process gases (i.e., reactive radicals) passing into the chamber body 10. For example, an inner surface 60 of the conduit 56 defining the passage connecting the remote plasma source 50 to the port 42 may be at least partially lined or fabricated from quartz. Additionally, the surfaces defining the plenum 48 and/or gas distribution plate 26 may also be at least partially coated or fabricated from quartz. For example, in the embodiment depicted in FIG. 1, a quartz ring 24 may circumscribe the outer boundary of the plenum 48. Additionally, a quartz liner 44 may be disposed on the bottom surface of the lid 40 defining the upper boundary of the plenum 48. The quartz surface 60 is believed to act as an ion filter to reduce the recombination of the radicals by providing a surface with which hydrogen-containing radicals can hydrogen bond and adsorb onto the quartz surface. Hydrogen-containing radicals that impinge on the quartz surface 60 release an adsorbed hydrogen-containing radical into the energized gas, thereby regenerating hydrogen radicals. The hydrogen ions are not regenerated by the quartz surface, and thus these ions recombine to form electrically neutral, non-ionic species. Thus, by passing the activated cleaning gas over the quartz surface, the reactive radicals are effectively filtered from the energized cleaning gas, while the radical species are preserved. The charged particles from recombined active radical are efficiently reduced.

Furthermore, process gases for the precleaning process of the present invention are excited into a plasma within the remote plasma source 50 which is in fluid communication with the reactive process chamber body 10 described above. The reactive radicals are generated from a group of selected cleaning gases comprising hydrogen gas, helium gas, or a combination thereof to react with contaminants on the substrate surface. After the plasma is struck, a hydrogen or helium gas or the combination thereof is introduced into the remote plasma source 50, and reactive radicals therefrom are generated. The generated reactive radicals then pass though the connecting conduit 56 and deliver into the process region 30 to clean contaminants. Subsequent to cleaning with the radicals from the plasma of the reactive radicals, native oxide and contaminants remaining in the substrate surface can be removed by the radicals generated therefrom.

In the present invention, dielectric layer on the substrate is precleaned with reactive radicals generated by a remote plasma source from $H_2$, He, or a mixture of $H_2$/He and delivered into a chamber through a generated magnetic filter. The filter is provided to neutralize the energized reactive radicals and reduce the charged particles potentially leaked from the plasma region and deliver the neutralized reactive radical to the substrate surface to react and clean the surface contaminant and residuals thereon. The neutralized reactive radicals remove residual photoresist, hydrocarbons, fluorocarbons, native oxides and polymers among others and provide a native oxide and residual free dielectric layer without further damaging the low-k film property.

Figure 5:
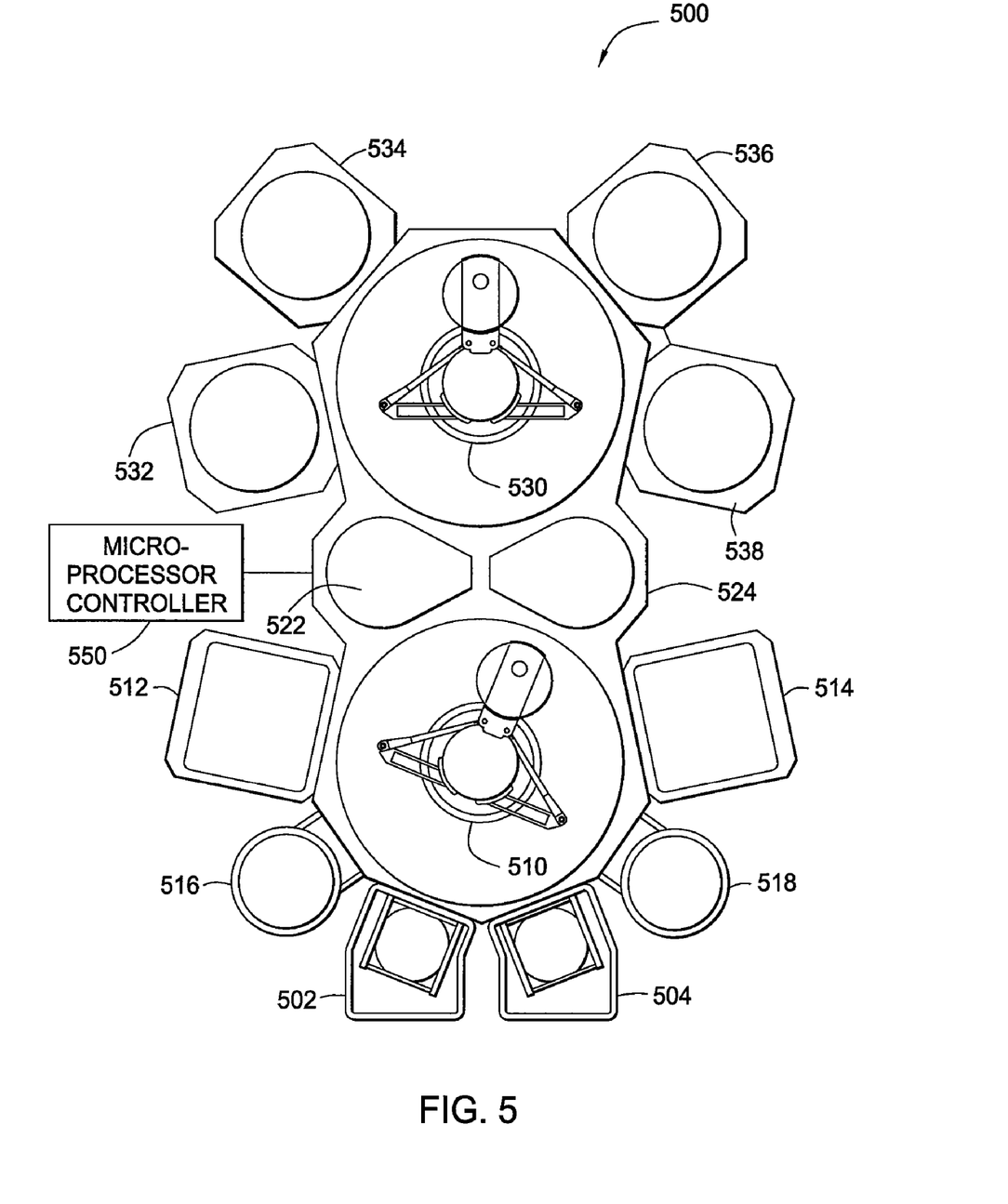
FIG. 5 is a schematic top view diagram of one example of a multi-chamber processing system which may be adapted to perform the process disclosed herein.

Different cleaning pressure may be used to adjust the cleaning efficiency upon different process requirement. In one embodiment, the precleaning process may contain hydrogen gas flowing at a rate of 1500 sccm, applying RF power at 1500 Watts, maintaining wafer temperature at 300 degrees Celsius, maintaining chamber in a higher pressure at 400 mTorr, wherein the etching rate of conventional photoresist thereto is around 800-1000 Å per minute. In another embodiment, the precleaning process may contain hydrogen gas flowing at a rate of 200 sccm, applying RF power at 1500 Watts, maintaining wafer temperature at 300 degrees Celsius, maintaining chamber in lower pressure at 30 mTorr, wherein the etching rate of conventional photoresist thereto is around 900-1100 Å per minute. In yet another embodiment, the precleaning process may contain hydrogen and helium gas at a ratio of 1:1, maintaining chamber pressure at 30 mTorr, wherein the etching rate of conventional photoresist thereto is 700-900 Å per minute. In yet another embodiment, the precleaning process may contain hydrogen and helium gas at a ratio of 3:7, maintaining chamber pressure at 45 mTorr, wherein the etching rate of conventional photoresist thereto is 600-800 Å per minute FIG. 5 is a schematic top-view diagram of an exemplary multi-chamber processing system 500 that may be adapted to perform processes as disclosed herein. Examples of systems are the Endura, Centura, and Producer processing system, commercially available from Applied Materials, Inc. Another similar multi-chamber processing system that may be adapted to benefit from the invention is disclosed in U.S. Pat. No. 5,186,718, entitled "Stage Vacuum Wafer Processing System and Method," issued on Feb. 16, 1993, which is incorporated by reference herein.

The system 500 generally includes load lock chambers 502, 504 for the transfer of substrates into and out from the system 500. Typically, since the system 500 is under vacuum, the load lock chambers 502, 504 may "pump down" the substrates introduced into the system 500. A first robot 510 may transfer the substrates between the load lock chambers 502, 504, processing chambers 512, 514, transfer chambers 522, 524, and other chambers 516, 518. A second robot 530 may transfer the substrates between processing chambers 532, 534, 536, 538 and the transfer chambers 522, 524. Each processing chamber 512, 514, 516, and 518 may be outfitted to perform a number of substrate processing operations such as cyclical layer deposition including atomic layer deposition (ALD), chemical vapor deposition (CVD), physical vapor deposition (PVD), etch, pre-clean, de-gas, orientation and other substrate processes. Also, at least one of the chambers 512, 514, 516, 518, 532, 534, 536, 538 is configured as processing chamber 100 described above. The first robot 510 also transfers substrates to or from one or more transfer chambers 522 and 524.

The transfer chambers 522 and 524 are used to maintain ultrahigh vacuum conditions while allowing substrates to be transferred within the system 500. A second robot 530 may transfer the substrate between the transfer chambers 522 and 524 and a second set of one ore more processing chambers 532, 534, 536 and 538. Similar to processing chambers 512, 514, 516, and 518, the processing chambers 532, 534, 536, and 538 can be outfitted to perform a variety of substrate processing operations, such as cyclical layer deposition including atomic layer deposition (ALD), chemical vapor deposition (CVD), physical vapor deposition (PVD), etch, pre-clean, de-gas, and orientation. Any of the substrate processing chambers 512, 514, 516, 518, 532, 534, 536, and 538 may be removed from the system 500 if not necessary for a particular process to be performed by the system 500.

The processing system includes one or more pre-clean chambers, as processing chamber 100, to preclean the substrate surface containing the dielectric layer as shown in FIG. 1, one or more atomic layer deposition (ALD) or PVD chambers configured to deposit barrier layer and one or more PVD chambers configured to deposit seed layers. To enhance efficiency and throughput of the system, one configuration of the processing system includes two precleaning chambers configured to pre-clean the substrate surface, two ALD or PVD chambers configured to deposit barrier layers and two PVD chambers configured to deposit seed layers disposed in connection to the back-end central transfer chamber. In one embodiment, the precleaning chamber may be 512, 514 the processing chamber 534, 536 may be a tantalum nitride (TaN) ALD or PVD chamber, and processing chamber 532 and 538 may be a copper or tantalum PVD chamber.

The substrate in the present invention is transferred into the precleaning chamber 512, 514 to preclean the contaminant on the surface of the substrate. Following the precleaning step, the substrate is transferred into a processing chamber 534, 536 to deposit a liner or barrier layer, such as Ti, Ti/TiN, Ta, Ta/TaN or the like on the exposed surface of the dielectric layer, and subsequently transferred the substrate to another processing chamber 532, 538 to further fill the exposed portions with Al, Cu, W, or other conductive material.

Figure 4:
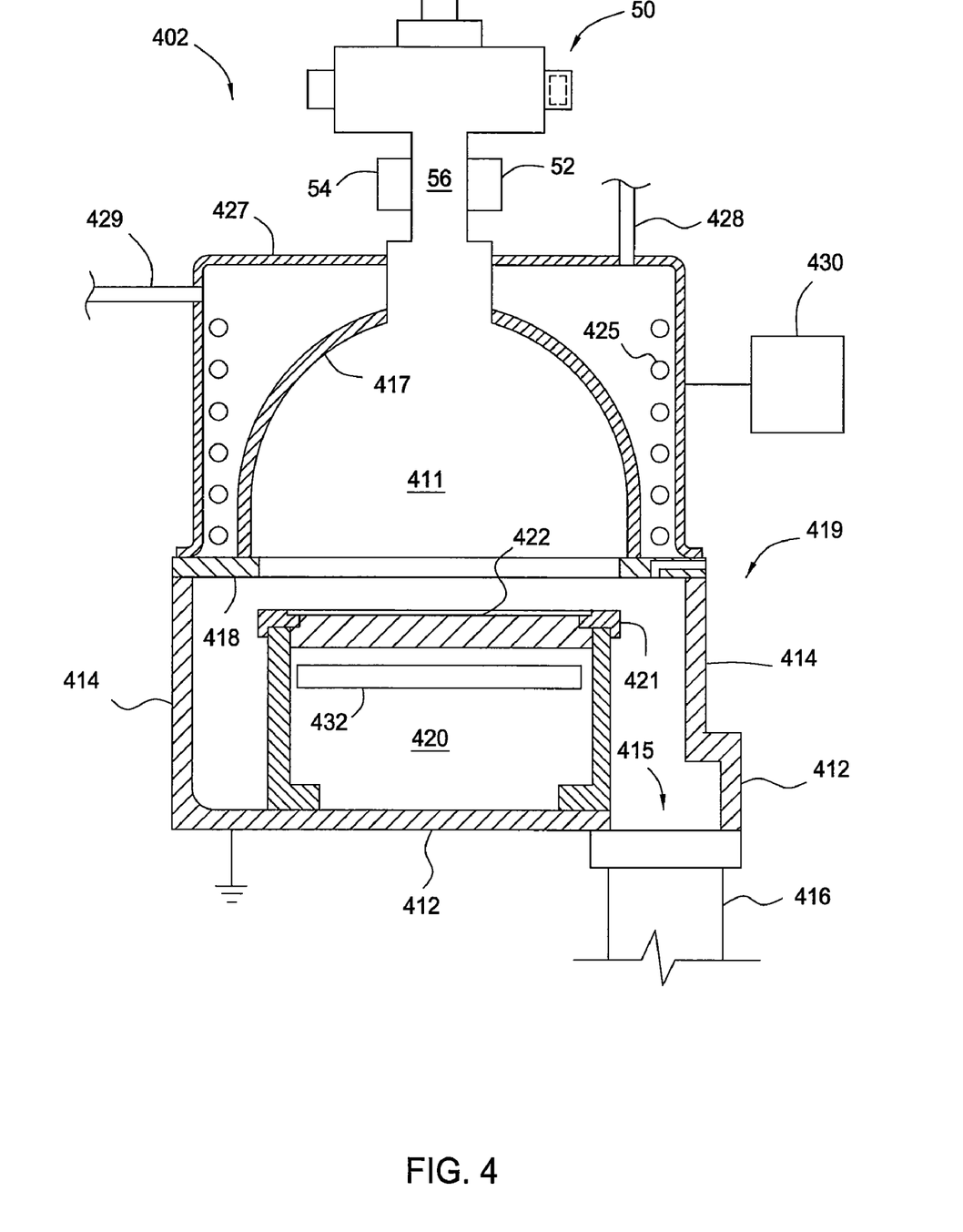
FIG. 4 is another embodiment of a reactive preclean chamber that may be used to practice embodiments of the invention described herein.

FIG. 4 is a schematic sectional view of an alternative reactive pre-clean chamber 402 that may be used to practice embodiments described herein. One chamber that may be adapted to benefit from the invention is a Preclean II chamber, available from Applied Materials, Santa Clara, Calif. The chamber 402 includes a vacuum chamber body 411 formed by a base member 412 having sidewalls 414, which may be made of metallic construction such as stainless steel, aluminum or the like. An opening 415 in the base of the body member 412 is connected to a turbo pump 416 which is used to control the gas pressure inside the chamber body 411. A quartz dome 417 forms the top of the chamber body 411 and is provided with a flange 418 around its circumference where it mates with the top circumference of the sidewalls 414 of base member 412. A gas distribution system 419 is provided at the juncture of quartz dome 417 and the base member 412. An insulating pedestal 420 made of quartz, ceramic or the like has a quartz cover 421 holding down a conductive pedestal 422 which is arranged to hold a wafer in the chamber body 411. A high frequency power supply 432, such as an RF power supply is capacitively coupled to the pedestal 422 and supplies a negative bias voltage thereto.

An antenna 425 such as an RF induction coil is wound exteriorly to quartz dome 417 to control the plasma density in the chamber body 411. The antenna 425 is supported by a cover 427. The antenna 425 may be formed of hollow copper tubing. An alternating axial electromagnetic field is produced in the chamber body 411 interiorly to the winding of the antenna 425. Generally, an RF frequency of from about 400 kHz to about 13.56 MHz is employed and an RF power supply 430 of conventional design (not shown) operating at this frequency is coupled to the antenna 425 by a matching network (not shown) to generate a plasma in the chamber body 411. The high frequency electromagnetic field generates a plasma within the portion of the chamber body 411 above the pedestal 422. A vacuum is drawn inside the chamber body 411 and process gases are pumped from one or more gas sources (not shown) through a gas inlet 429 into the chamber body 411. An exhaust outlet 428 may be used to vent gases outside the chamber body 411.

A remote plasma source 50 is disposed to the top of the chamber 402 by a connecting conduit 56. The remote plasma source 50 generates plasma to form a plurality of reactive radicals thereby delivering the radicals to the chamber body 411 through the connecting conduit 56. The remote plasma source 50 is placed a distance from the chamber body 411 such that the remotely reactive radicals travel across a distance to the chamber body 411 and pass though a filter 200. The filter is arranged to locate in the connecting conduit 56 to filter and neutralize the energized reactive radical generated from remote plasma source 50.

Thus, an apparatus and a method for cleaning a dielectric film have been provided that adventurously improves the low-k film quality and reduces the low-k film degradation after a precleaning process prior to conductive layer deposition.

While the foregoing is directed to embodiments of the present invention, other and further embodiments of the invention may be devised without departing from the basic scope thereof, and the scope thereof is determined by the claims that follow.

What is claimed is:

1. A method of cleaning a dielectric layer, comprising:
providing a substrate having an at least partially exposed dielectric layer disposed in a process chamber;
generating a plurality of reactive radicals in a remote plasma source;
flowing the reactive radicals from the remote plasma source into the process chamber through a passage having at least one magnet disposed adjacent the passage;
exposing the reactive radicals to a quartz surface of the passage downstream of the remote plasma source; and
magnetically filtering the reactive radicals passing through the passage.

2. The method of claim 1, further comprising:
adjusting a magnetic field by the magnet disposed adjacent the passage.

3. The method of claim 1, further comprising:
heating the substrate to a temperature between about 250° C. to about 350° C.

4. The method of claim 1, further comprising:
neutralizing charged particles in the passage.

5. The method of claim 4, further comprising:
drawing the charged particles into contact with walls of the passage.

6. The method of claim 1, further comprising:
disposing two or more magnets adjacent the passage.

7. The method of claim 6, wherein the two or more magnets are disposed on opposite sides of an outer periphery of the passage.

8. The method of claim 6, further comprising:
varying the distance between the two or more magnets to adjust a magnetic field.

9. The method of claim 1, further comprising:
cleaning the exposed dielectric layer with the filtered reactive radicals.

10. The method of claim 9, further comprising:
depositing a barrier layer on at least a portion of the cleaned dielectric layer.

11. The method of claim 10, wherein the dielectric layer is a low k material.

12. A method of cleaning a dielectric layer, comprising:
providing a substrate having an at least partially exposed dielectric layer disposed in a process chamber;
generating a plurality of reactive radicals in a remote plasma source;
maintaining the process chamber at a pressure less than about 400 mTorr;
applying a remote plasma source power within a range of about 1200 to 1800 W;
flowing hydrogen gas to the chamber;
flowing the reactive radicals from the remote plasma source into the process chamber through a passage having at least one magnet disposed adjacent the passage;
magnetically filtering the reactive radicals passing through the passage; and
cleaning the exposed dielectric layer with the filtered reactive radicals.

13. The method of claim 12 wherein maintaining chamber pressure further comprises:
maintaining the process chamber at a pressure of about 30 mTorr.

14. The method of claim 12, further comprising:
flowing helium gas to the process chamber.

15. A method of cleaning a dielectric layer, comprising:
providing a substrate having an at least partially exposed dielectric layer disposed in a first process chamber;
generating a plurality of reactive radicals in a remote plasma source;
flowing the reactive radicals from the remote plasma source into the first process chamber through a passage having at least one magnet disposed adjacent the passage;
magnetically filtering charged particles from the reactive radicals passing through the passage;
exposing the reactive radicals to a quartz surface of the passage downstream of the remote plasma source;
removing charged particles passing from the remote plasma source;
cleaning exposed portions of the dielectric layer using the filtered radicals;
transferring the cleaned substrate to a second processing chamber without breaking vacuum; and
depositing a liner layer on the cleaned substrate in the second process chamber.

* * * * *

UNITED STATES PATENT AND TRADEMARK OFFICE
CERTIFICATE OF CORRECTION

PATENT NO. : 7,658,802 B2 Page 1 of 1
APPLICATION NO. : 11/284775
DATED : February 9, 2010
INVENTOR(S) : Fu et al.

It is certified that error appears in the above-identified patent and that said Letters Patent is hereby corrected as shown below:

Title Page,
In the References Cited (56):

Please delete "6,660,880 B2 12/2003 Haukka et al." and insert --6,660,660 B2 12/2003 Haukka et al.-- therefor;

In the Claims:

Column 10, Claim 15, Line 18, please delete "processing" and insert --process-- therefor.

Signed and Sealed this

Twenty-seventh Day of April, 2010

David J. Kappos
*Director of the United States Patent and Trademark Office*